United States Patent [19]
Richards

[11] Patent Number: 5,225,773
[45] Date of Patent: Jul. 6, 1993

[54] SWITCH PROBE

[75] Inventor: Michael A. Richards, Cheshire, England

[73] Assignee: Interconnect Devices, Inc., Kansas City, Kans.

[21] Appl. No.: 843,944

[22] Filed: Feb. 26, 1992

[51] Int. Cl.$^5$ .............................................. G01R 1/04
[52] U.S. Cl. ................................ 324/158 P; 324/72.5; 324/158 F; 200/61.76; 439/482
[58] Field of Search ............... 324/72.5, 158 P, 158 F, 324/149; 439/218, 219, 482, 259, 265; 200/16 B, 61.76, 51.09

[56] References Cited

U.S. PATENT DOCUMENTS

| | | | |
|---|---|---|---|
| 2,020,402 | 11/1935 | Edwards et al. | 439/482 |
| 2,515,004 | 7/1950 | Haupt | 439/482 |
| 2,857,572 | 10/1958 | Belart | 439/482 |
| 3,753,103 | 8/1973 | Tetreault et al. | |
| 4,321,532 | 3/1982 | Luna | |
| 4,560,926 | 12/1985 | Cornu et al. | |
| 4,658,212 | 4/1987 | Ozawa et al. | |
| 4,783,624 | 11/1988 | Sabin | |
| 4,904,213 | 2/1990 | Hock et al. | 439/482 |
| 4,918,384 | 4/1990 | Giringer et al. | |
| 4,983,909 | 1/1991 | Swart et al. | |
| 5,004,977 | 4/1991 | Kazama | 324/158 P |
| 5,014,004 | 5/1991 | Kreibich et al. | |
| 5,032,787 | 7/1991 | Johnston et al. | |

FOREIGN PATENT DOCUMENTS

| | | | |
|---|---|---|---|
| 1036969 | 8/1958 | Fed. Rep. of Germany | 439/219 |
| 0093968 | 5/1985 | Japan | 324/158 P |
| 0021065 | 1/1987 | Japan | 324/158 P |

Primary Examiner—Ernest F. Karlsen
Assistant Examiner—William J. Burns
Attorney, Agent, or Firm—Wm. Bruce Day

[57] ABSTRACT

A switch probe, generally for use in testing cable harnesses, is for placement within a standard probe receptacle and can be removed and replaced as necessary. The switch probe includes a conductive barrel with a front open end and a rear closed end. A conductive first switch portion is received within the barrel at the rear closed end and includes a first shaft projecting forwardly. A conductive second switch portion is received within the barrel and has an engagement tip positioned forwardly of the barrel open end for electrical contact with a test site. A second shaft extends rearwardly and into axially spaced relation to the first shaft. An elongate hollow insulator extends fully between and provides a guideway for reciprocatory contact between the first and second shafts and fully shields the second shaft from electrical leakage prior to conductive contact of the second shaft with the first shaft. When the first and second shafts contact each other, the current path is closed and electrical current now flows from the receptacle through the barrel and into the second shaft to the test site.

5 Claims, 2 Drawing Sheets

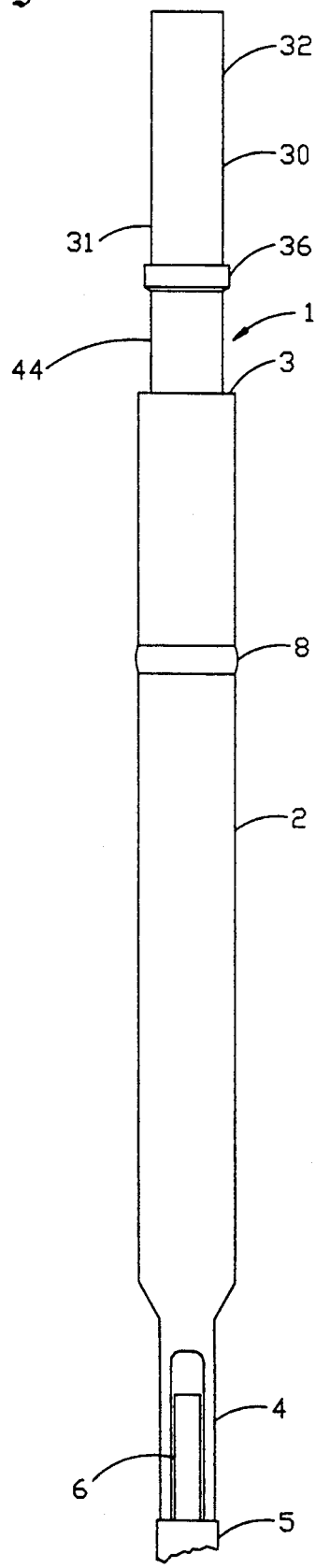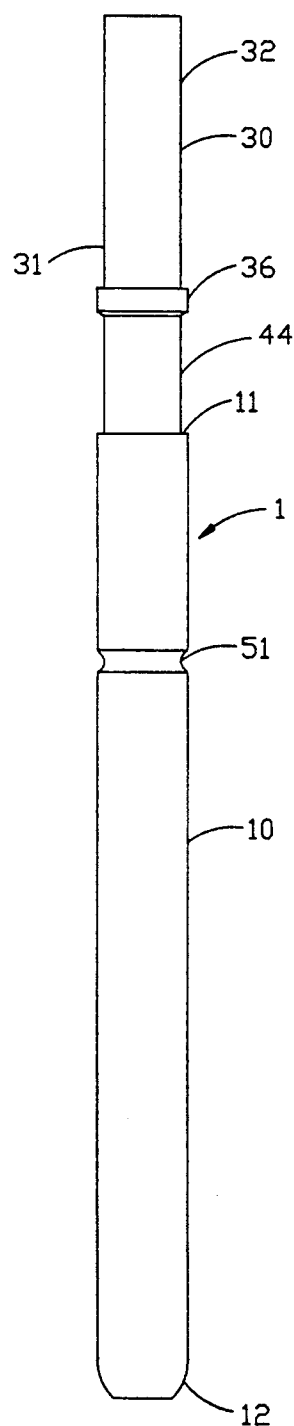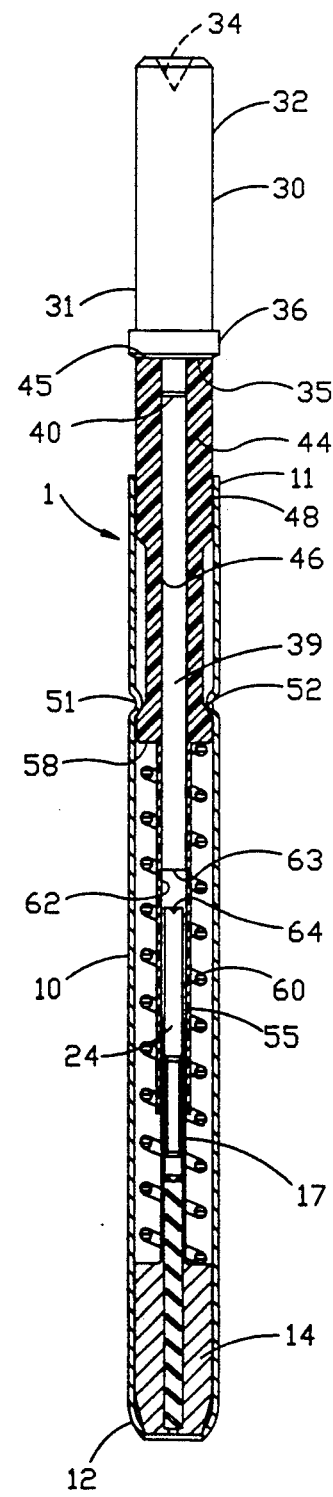

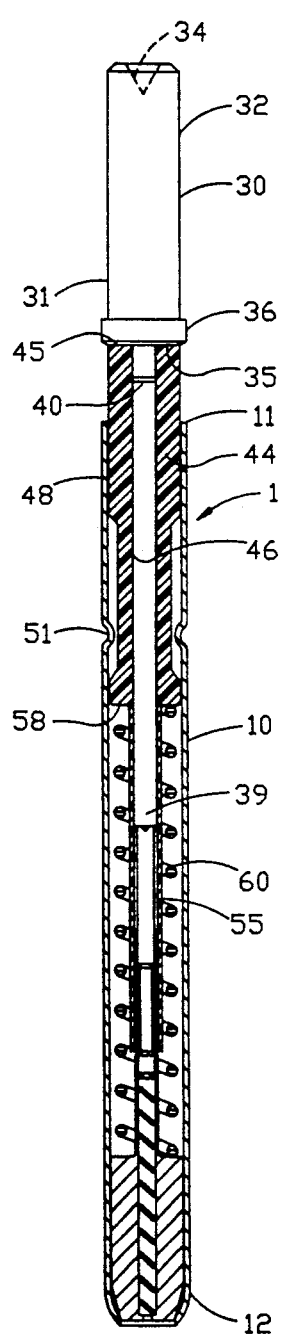
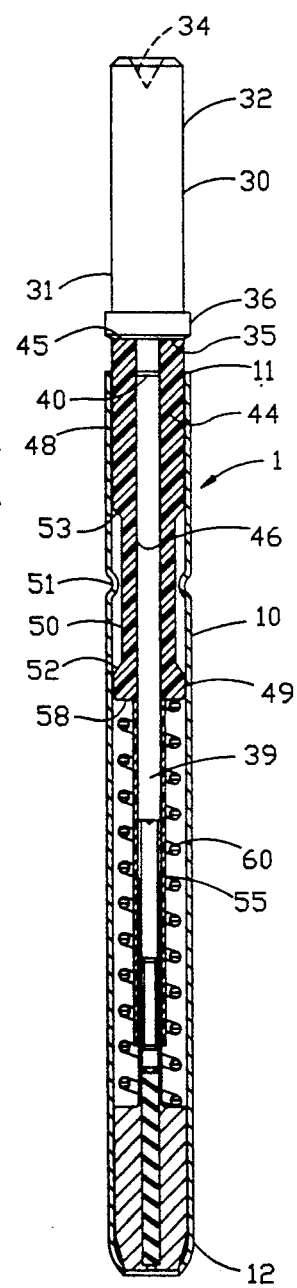
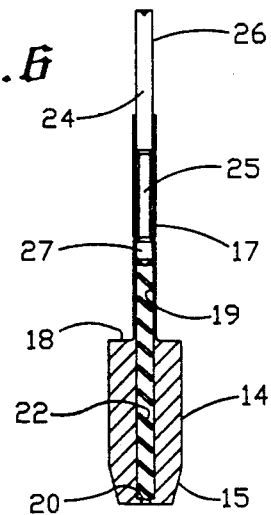
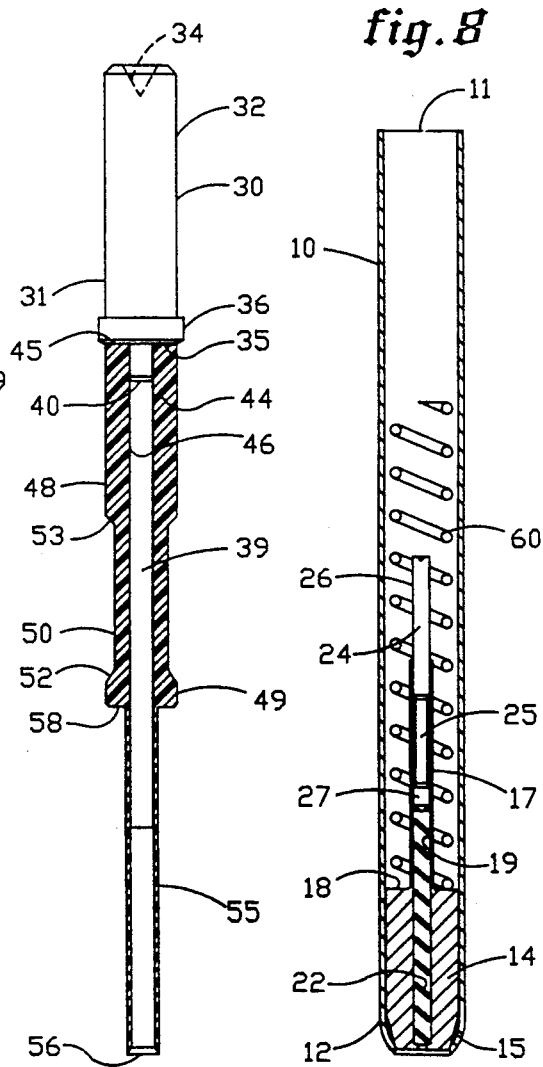

SWITCH PROBE

FIELD OF THE INVENTION

This invention relates to electrical spring contact probes and particularly to switch probes. Switch probes are those in which an initial spring force must be overcome before there is electrical continuity from the probe to the test site.

BACKGROUND OF THE INVENTION

Various types of test probes are used in the automatic testing of electrical circuits, depending upon the type of electrical device under test. Some types of probes are particularly adapted to use on printed circuit boards for test of the electrical continuity of the test sites whereas other probes are used in testing wiring harnesses. Switch probes have often been used for testing cable harnesses for vehicles. Switch probes provide electrical continuity only when the switch probe plunger is pushed back into the probe body a sufficient distance to close an internal switch. This produces a closed circuit in the testing probe so that electrical current can flow to the device under test. The flow of electrical current in turn provides a closed circuit in the testing apparatus, indicating that the cable harness terminal has been seated or mounted properly.

In the testing of unmounted cable harnesses, a relatively large outward force is applied to each cable harness terminal by the switch probe during each cycle. If the terminal is not seated properly in the cable harness, the terminal is pushed out of the way by the probe and the switch is prevented from closing. This produces an open circuit in the tester, indicating that the terminal was not seated or mounted properly. If the terminal is mounted properly in the harness, the pressure applied by the switch probe to the terminal during the cycle causes the switch probe plunger to travel sufficiently far to close the switch. This produces a closed circuit on the tester, indicating that the cable harness terminal has been seated or mounted properly.

U.S. Pat. No. 4,983,909 explains switch probes and provides in its FIG. 1 an exemplary prior art switch probe. It is disclosed in the aforementioned patent that a typical switch probe is a miniature size device which includes an outer barrel, a terminal at one end of the barrel, a moveable plunger projecting from the opposite end of the barrel, and a coil spring inside the barrel between the plunger and the terminal. A downward force applied to the plunger against the bias of the spring moves the plunger toward a switch point on the terminal inside the probe. The force applied under test is controlled by the spring constant of the coil spring. If the cable harness is faulty, maximum design force is not reached and the plunger does not close the switch. If the cable harness terminal is wired properly, the maximum design force is reached and the plunger contacts the switch point.

Further as set forth herein, the switch probes are subject to an extreme amount of abuse because of the constant rapid cycling for testing millions of cable harness terminals. Because the terminals of the device under test are closely spaced apart, the switch probes are typically a miniature size and are spaced apart by a distance of about one-tenth of an inch on center.

A continuing problem with switch probes has been that they are typically not designed for use with standard receptacles, but are difficult to remove and replace in the test fixture. The use of a switch probe of standard size to fit in a receptacle would lower cost and provide ease of replacement. Additionally, in some switch probes, the switch probe can be signaled on when the internal switch portions are not fully in physical contact with each other.

OBJECTS OF THE INVENTION

The objects of the present invention are: to provide a switch probe which provides electrical continuity only when the probe plunger has been retracted a sufficient distance into the probe barrel to contact other internal components to complete the electrical circuit; to provide such a switch probe in which an internal insulator extends the full internal length of the probe to prevent inadvertent signaling of a closed contact; to provide such a switch probe which is designed to be easily removed from a standard receptacle and replaced; and to provide such a switch probe which is economical to manufacture and well designed for the intended purpose.

Other objects and advantages of this invention will become apparent from the description of the preferred embodiment.

SUMMARY OF THE INVENTION

The present invention provides a switch probe removable and replaceable in a receptacle and having a conductive barrel with a front open end and a rear closed end. A conductive first switch portion is received within the barrel at the rear closed end and includes a first shaft projecting forwardly and a rear portion in electrical contact with the barrel rear, closed end. A conductive second switch portion is received within the barrel and has an engagement tip positioned forwardly of the barrel open end for electrical contact with a test site. A second shaft extends rearwardly from the engagement tip and into axially spaced relationship to the first shaft. An elongate hollow insulator extends fully between and provides a guideway for reciprocatory contact between the first and second shafts and fully shields the second shaft from electrical leakage prior to engagement of the second shaft with the first shaft. A spring extends between the first switch portion of the second switch portion and urges the second switch portion forwardly.

BRIEF DESCRIPTION OF THE DRAWINGS

FIG. 1 is a elevational view of the switch probe placed within a receptacle.

FIG. 2 is a elevational view of the switch probe.

FIG. 3 is a longitudinal sectional view of the switch probe and showing the probe tip in an extended position.

FIG. 4 is a longitudinal sectional view of the switch probe and showing tip in a partially retracted position.

FIG. 5 is a longitudinal sectional view of the switch probe and showing the engagement tip in a fully retracted position.

FIG. 6 is a longitudinal sectional view of one of the switch portions in the switch probe device.

FIG. 7 is a longitudinal sectional view of another one of the switch portion in the switch probe.

FIG. 8 is a longitudinal section view of the probe barrel receiving the switch portions shown in FIG. 6.

DETAILED DESCRIPTION OF THE PREFERRED EMBODIMENT

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Referring in more detail to the drawings:

The reference numeral 1, FIG. 1, generally indicates a switch probe which has been received within a receptacle 2. The receptacle 2 has a front, open receiving end 3 and a rear closed end 4 having means for connection to an electrical conductor 5. In the illustrated example, the electrical conductor 5 is a thin, insulated wire having a stripped end 6 soldered to the end 4. The receptacle 2 is in electrical contact with a test circuit to provide electrical continuity to the switch probe. The receptacle 2 is ordinary placed within a test matrix (not shown), consisting of a thick layer of insulative material, such as a plastic or fiberglass material, and is held within a bore in the matrix by friction fit with an expanded circumferential ring 8. With the use of the receptacle 2 in combination with the switch probe 1, the receptacle 2 is maintained in place within the test matrix and the switch probe 1 is removed and replaced as desired.

Referring to FIG. 2, the switch probe 1 is removably emplaced within the receptacle 2 and in the illustrated example includes a conductive barrel 10 having a front open end 11 and a rear closed end 12. The barrel open end 11 is generally placed within the receptacle 2 so that the barrel open end is coincident with the receptacle open end 3 and the barrel closed end 12 is generally coincident with the receptacle closed end 4. The barrel 10 is a hollow cylindrical member and has inserted within it an assembly of first and second switch portions, springs and an insulator as hereinafter disclosed.

A conductive first switch portion 14, FIGS. 3 and 6, is received within the barrel 10 at the barrel rear closed end 12 and includes an expanded head portion 15 generally shaped to conform to the interior configuration of the barrel end 12 and with an axially projecting hollow tubular member 17 extending forwardly from the head portion 15. A medial shoulder 18 is provided at a juncture of the tubular member 17 and the head portion 15. The hollow tubular member 17 includes an interior passage way 19 which extends therethrough and downwardly into the head portion 15, stopping short therein to provide an interior bore end 20.

A coil spring 22 is received within the bore 19 and bottoms at the bore end 20. A pin member 24 of a thin diameter has a plunger 25 nonretractibly extending from a barrel 26 and is inserted into the bore with the spring 22 located between the pin member 24 and the bore end 20. The plunger 25 includes an expanded tip 27 in contact with the coil spring 22.

A conductive second switch portion 30 is received within the barrel 10 generally at the front open end 11 and includes an elongate plunger 31 having an expanded engagement tip 32 positioned forwardly of the barrel front end 11 for contact with a test site. The engagement tip 32 can be of various styles and can be shaped for penetrating varnishes and other contaminants on the surface of the test site. In the illustrated example, the engagement tip 32 includes a V-shaped center recess 34. The engagement tip 32 further includes a medial shoulder 35 and a medial ring 36 with the medial ring 36 acting as a stop against the barrel open end 11 in the event that the second switch portion 30 is fully retracted into the barrel 10. The second switch portion 30 also includes an elongate, axial rearwardly projecting plunger shaft 39 which extends rearwardly of the engagement tip 32 and joins the engagement tip at the medial shoulder 35. Preferably, the plunger shaft 39 has an expanded circumferential ring 40 adjacent the shoulder 35 so that an insulator 44 may be slipped over the plunger shaft 39 and held by a friction fit.

In the illustrated example, FIG. 7, the insulator 44 is an elongate, hollow member received within the barrel 10 and extending between the first switch portion 14 and the second switch portion 30 and includes a forward end 45 abutting the medial shoulder 35. In the illustrated example, the insulator 44 includes a through bore 46 snugly receiving the plunger shaft 39 in a friction fit and so that the insulator 44 moves with the second switch portion 30 reciprocally relative to the barrel 10. The insulator 44 includes an expanded portion 48 sized for sliding receipt within the barrel 10 and with an inner knob end 49, FIG. 7, also sized for sliding receipt within the barrel 10. Between the knob end 49 and the expanded portion 48 is a necked portion 50, which in cooperation with a detent ring 51 in the barrel 10, provides stop limits to the sliding of the insulator 44 and second switch portion 30 within the barrel 10. The necked portion 50 includes an outward travel limit shoulder 52 which limits travel as shown in FIG. 3 and an inward travel limit shoulder 53 which limits inward travel (not shown).

The insulator 44 continues from the expanded portion 48 adjacent the knob head 49 to an elongate, rearwardly extending hollow shaft portion 55 having the bore 46 therethrough and which has a termination end 56 and a medial shoulder 58 against which a spring, described hereinafter, is seated. The shaft portion extends a sufficient length to project beyond the end of the plunger shaft 39 and over the pin member 24 and the hollow tubular member 17.

In the assembly of the first switch portion 14, the second switch portion 30 and the insulator 44 in the barrel 10, the first switch portion 14, FIG. 6, with the pin member 24 positioned as shown, is positioned at the end 12 of the barrel 10 and with the hollow tubular member 17 projecting toward the barrel open end 11. The pin member 24 is spring biased toward the barrel end 11 by the coil spring 22. A larger diameter coil spring 60 is slid over the hollow tubular member 17 to abut the shoulder 18, FIG. 8. Next, the second switch portion 30 is inserted into the insulator 44 whereby the plunger shaft 39 is received within the insulator shaft portion 55, and the insulator 44 is retained relative to the switch portion 30 by the ring 40 and abutting the medial shoulder 35. The second switch portion 30 and insulator 44 are slid into the barrel open end 11 so that the opposite end of the coil spring 60 engages the medial shoulder 58 and the detent ring 51 is formed in the barrel 10 to act as a stop against the outward and inward travel limit shoulders 52 and 53 of the insulator expanded portion 48.

In use, the second switch portion 30 is biased to an outward position, FIG. 3, wherein there is a gap 62 between a remote end 63 of the plunger shaft 39 and a remote end 64 of the pin member 24. In this situation, the remote end 63 and 64 are electrically isolated from each other and with the insulator shaft portion 55 acting as a guideway. In this position there is not electrical continuity and any testing apparatus will show an open circuit when the second switch portion 30 is in the extended position. When the plunger tip 32 encounters the test site, as the testing fixture is brought into contact, the second switch portion 30 is urged inwardly of the barrel 10 and the coil spring 60 compresses to close the gap 62. The electrical continuity is created and the testing system will show a closed circuit. Upon further retreat of the second switch portion 30 into the barrel 10, the coil spring 22 compresses to provide further contact between the remote ends 63 and 64.

When the switch probe 1 is desired to be removed and replaced, it is simply pulled from the receptacle 2 and a replacement inserted. Replacement does not entail any wire or conductor connections because the receptacle is the member having the wire or conductor.

Preferably all metal parts are of a highly conductive material such as a beryllium copper alloy, the springs are of stainless steel, and the material of the insulator 44 is a polyamide.

It is to be understood that while certain embodiments of the present invention have been illustrated and described, it is not to be limited to the specific forms or arrangement of parts herein shown, except as set forth in the following claims.

What is claimed and desired to be secured by Letters Patent is as follows:

1. A switch probe comprising:
   (a) a conductive barrel having a front, open end and with a rear, closed end;
   (b) a conductive first switch portion received within said barrel at said rear closed end and including a first shaft means projecting forwardly, and a rear portion in electrical contact with said barrel rear, closed end;
   (c) a conductive second switch portion received within said barrel and having an engagement tip positioned forwardly of said barrel open end for electrical contact with a test site and including a second shaft means extending rearwardly and into axially spaced relation to said first shaft means;
   (d) an elongate, hollow insulator means extending fully between and providing a guideway for reciprocatory contact between said first and second shaft means and fully shielding said second shaft means from electrical leakage prior to engagement of said second shaft means with said first shaft means; and
   (e) spring biasing means extending between said first switch portion and said second switch portion and urging said second switch means forwardly.

2. The switch probe set forth in claim 1 wherein said insulator means includes an elongate hollow shaft extending rearwardly.

3. The switch probe set forth in claim 2 wherein said biasing means is a coil spring extending radially about said insulator hollow shaft.

4. A switch probe comprising:
   (a) a receptacle having a front, open, receiving end, and a rear, closed end having means for connection to an electrical conductor;
   (b) a conductive barrel removably positioned in said receptacle and in electrical contact therewith, and having a front, open end for positioning generally coincident with said receptacle front open end and with a rear, closed end received within said receptacle;
   (c) a conductive first switch portion received within said barrel at said barrel rear closed end and including;
      i. an expanded head portion;
      ii. an axially projecting hollow tubular member extending forwardly through said head portion;
      iii. a shoulder at a juncture of said tubular member and said head portion;
      iv. a pin member reciprocally mounted within said tubular member;
      v. a first coil spring received within said tubular member and urging said pin member forwardly;
   (d) a conductive switch portion received within said barrel generally at said front, open end and including;
      i. an elongate plunger having an expanded engagement tip positioned forwardly of said barrel front end for contact with a test site and a rearward ring portion for abutment with said receptacle front open end;
      ii. an elongate, axial, rearwardly projecting plunger shaft extending rearwardly of said tip and having a medial shoulder;
   (e) an elongate insulator received within said barrel and extending between said first and second switch portions and including a forward end reciprocally received in said barrel front end and against said medial shoulder means extending between said insulator and said barrel providing reciprocation between extended and retracted positions, and having a rearwardly extending hollow shaft extending over said first switch portion tubular member and said pin member, with an abutment between said insulator forward end and said hollow shaft; and
   (f) a second coil spring received within said barrel and extending between said shoulder of said first switch portion and said abutment of said insulator for urging said insulator and said second switch portion reciprocally forwardly with respect to said second switch portion and protruding from said barrel;
   (g) said second switch portion retracting a first distance into said barrel so that said plunger shaft electrically contacts said pin member to close a circuit to said barrel and receptacle and retracting a second distance as said pin member retracts into said tubular member.

5. A switch probe comprising:
   (a) a conductive barrel having a front, open end and with a rear, closed end;
   (b) a conductive first switch portion received within said barrel at said rear closed end and including a first shaft means projecting forwardly, and a rear portion in electrical contact with said barrel rear, closed end;
   (c) a conductive second switch portion received within said barrel and having an engagement tip positioned forwardly of said barrel open end for electrical contact with a test site and including a second shaft means extending rearwardly and into axially spaced relation to said first shaft means;
   (d) an elongate, hollow insulator means extending fully between and providing a guideway for reciprocatory contact between said first and second shaft means and fully shielding said second shaft means from electrical leakage prior to engagement of said second shaft means with said first shaft means;
   (e) spring biasing means extending between said first switch portion and said second switch portion and urging said second switch means forwardly; and
   (f) replaceable and removable means for said second shaft means from said barrel.

* * * * *